(12) United States Patent
Takeda et al.

(10) Patent No.: US 7,767,053 B2
(45) Date of Patent: Aug. 3, 2010

(54) SUBSTRATE PROCESSING APPARATUS AND SUBSTRATE PROCESSING METHOD

(75) Inventors: Tomohiko Takeda, Tokyo (JP); Ken Sugihara, Tokyo (JP); Katsuyoshi Hamano, Tokyo (JP); Teruo Yoshino, Tokyo (JP); Nobuo Ishimaru, Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 186 days.

(21) Appl. No.: 11/984,186

(22) Filed: Nov. 14, 2007

(65) Prior Publication Data

US 2008/0075640 A1    Mar. 27, 2008

Related U.S. Application Data

(63) Continuation of application No. 10/549,279, filed as application No. PCT/JP2004/011162 on Aug. 4, 2004, now abandoned.

(30) Foreign Application Priority Data

Aug. 7, 2003    (JP)    .............................. 2003-289223

(51) Int. Cl.
C23F 1/00     (2006.01)
H01L 21/306   (2006.01)
(52) U.S. Cl. .................................. 156/345.28
(58) Field of Classification Search ............. 156/345.28
See application file for complete search history.

(56) References Cited

U.S. PATENT DOCUMENTS 5,810,963 A * 9/1998 Tomioka ................ 156/345.28

2005/0034811 A1 * 2/2005 Mahoney et al. ........ 156/345.24

FOREIGN PATENT DOCUMENTS

| JP | A-57-159537 | 10/1982 |
| JP | A-05-335869 | 12/1993 |
| JP | A-07-503577 | 4/1995 |
| JP | A-07-135098 | 5/1995 |
| JP | A-09-092491 | 4/1997 |

(Continued)

Primary Examiner—Michael Cleveland
Assistant Examiner—Keath T Chen
(74) Attorney, Agent, or Firm—Oliff & Berridge, PLC

(57) ABSTRACT

To effectively prevent a micro arc causing damage to an apparatus and a substrate, by detecting a generation of the micro arc. A substrate processing apparatus is constituted so as to generate a plasma P, by applying a high frequency power to an electrode 210 provided in a processing chamber 200 from a high frequency power supply part 100 through a matching unit 300. A directional coupler 121 is provided between a high frequency power source 111 and the matching unit 300, so that a reflected wave reflected from the electrode 210 and a traveling wave advancing toward the electrode 210 are coupled to a detector 122. The detector 122 outputs a detection signal, when a level of a reflected wave Pr and a differential level thereof exceed each set value. In order to place an initial period of discharge out of a detection period, a delay traveling wave, which is a delayed traveling wave, is also outputted. A controller 130 determines the generation of a harmful micro arc, when coincidence of three detection signals outputted from the detector 122 is obtained, supplies an RF cut signal to a CPU 116, and temporarily stops or temporarily decreases a high frequency power from the high frequency power source 111.

3 Claims, 6 Drawing Sheets

FOREIGN PATENT DOCUMENTS

| | | |
|---|---|---|
| JP | A-10-074734 | 3/1998 |
| JP | A-2000-133412 | 5/2000 |
| JP | A-2001-102196 | 4/2001 |
| JP | A-2001-516940 | 10/2001 |
| JP | A-2002-176034 | 6/2002 |
| JP | A-2003-173973 | 6/2003 |
| JP | A-2004-194420 | 7/2004 |
| WO | WO 94/16458 | 7/1994 |

* cited by examiner

SUBSTRATE PROCESSING APPARATUS AND SUBSTRATE PROCESSING METHOD

This is a Continuation of application Ser. No. 10/549,279 filed Oct. 19, 2005 now abandoned, which in turn is a PCT National Phase of PCT/JP2004/11162 filed Aug. 4, 2004, which claims the benefit of Japanese Patent Application No. 2003-289223 filed Aug. 7, 2003. The disclosures of the prior applications is hereby incorporated by reference herein in their entirety.

TECHNICAL FIELD

The present invention relates to a substrate processing apparatus and a substrate processing method for processing a substrate by using a plasma, and particularly to an apparatus and a method for preventing the generation of micro arc.

BACKGROUND ART

Micro arc is a local and instantaneous abnormal discharge in a plasma. The micro arc is generated in a plasma processing apparatus. As the plasma processing apparatus, a capacity-coupling type plasma processing apparatus by parallel plate electrodes such as shown in FIG. 5 is given as an example. In this plasma processing apparatus, parallel plate electrodes 20 are provided in a processing chamber 10, and a substrate W is placed in a grounded lower electrode (anode) 20a. A high frequency power source 40 is connected to an upper electrode (cathode) 20b through a matching unit 30, and a high frequency electric power is applied between the electrodes 20. When a reactive gas is supplied to the processing chamber 10, arc discharge occurs between the electrodes 20, and a plasma P is generated. By the plasma P, the reactive gas is activated and a processing such as a film forming is applied on the substrate W.

During arc discharge, dust falls from the electrodes 20, or a thin film is peeled off from the surfaces of the electrodes 20. The fallen dust and the peeled thin film trigger the micro arc to be generated. A damage caused by the micro arc is generated not only on the side of the cathode 20b, where abnormality is easily caused on the surface of an electrode, but also on the surface of the substrate on the anode 20a or on an inner wall of a processing chamber. In FIG. 5, micro arcs 50a, 50b, and 50c generated on the surface of the substrate, on the surface of the cathode, and on the inner wall of the processing chamber are respectively shown. An electrode cover (not shown) formed by joining a plurality of ceramics plates is used around the substrate W, and in some cases, the micro arc is generated also in its joint. Note that the substrate W is a glass substrate for LCD, and a semiconductor wafer substrate or the like.

DISCLOSURE OF THE INVENTION

Problem to be Solved

In recent years, the glass substrate for LCD and a semiconductor silicon substrate have been enlarged, and when the frequency of occurrence of the micro arc per unit area is constant, the frequency and probability of occurrence of the micro arc are increased in association with the enlargement of a substrate size. In addition, voltage to be applied to a discharge electrode is made high with an enlargement of the substrate. However, in association with the increase in the voltage to be applied to the discharge electrode, the frequency of occurrence and probability of the micro arc are also increased.

When the micro arc is generated, the surface of a metal electrode is partially melted, lost, and hollowed out by the micro arc, and metallic splashes thereof covers over the substrate to cause metal contamination of the substrate. In addition, by a peeling off of the thin film caused by the micro arc, foreign matters and fragments of the film are stuck to the substrate, and a distribution of a film thickness on the substrate becomes locally abnormal. Further, decrease in a total yield is generated, and the damage is caused to the substrate processing apparatus, thereby shortening a maintenance period, resulting in a decline in an operation rate and productivity of the substrate processing apparatus.

In the conventional small-size substrate with low voltage, the micro arc is less problematic. However, as described above, in association with the increase in the size of the substrate and the voltage to be applied to the electrode, damage becomes heavy, thereby necessitating a request for prevention of the micro arc generation.

Therefore, when the micro arc is generated, it is necessary to quickly detect it and instantaneously stop the micro arc. In a usual arc discharge, a high voltage and large current flows, and therefore the detection of such an arc discharge is easy. However, in the micro arc discharge, a low voltage and small current flows, and the micro arc discharge is locally generated, and therefore the detection of such a micro arc discharge is difficult.

This is not limited to a capacity-coupling type, and the same thing can be said for a modified magnetron type, an inductively coupled type, and a helicon wave type.

Note that when a high frequency discharge is replaced with a CW pulse discharge, the generation of the micro arc can be prevented. However, an average high frequency power supplied to the electrode is decreased, involving a problem that a speed of the film formation is lowered, resulting in a deterioration of the quality of the film. Therefore, it is impossible to adopt the CW pulse discharge.

Meanwhile, by increasing the high frequency power supplied between the electrodes, the detection of the micro arc is possibly facilitated. However, when the high frequency power is increased, the probability of the micro arc is increased accordingly, and the frequency of generation of the micro arc is also increased. Therefore, it is also impossible to adopt a method of increasing the high frequency power.

An object of the present invention is to provide a substrate processing apparatus capable of preventing a generation of micro arc by solving the aforementioned problems of the conventional art.

Means to Solve the Problem

In view of the above-described problems, the present invention takes several aspects as follows.

In a first aspect, which has a high frequency power supply part with a controllable high frequency power source, applies a high frequency power from the high frequency power source to a discharge electrode provided in a processing chamber through a matching unit, and generates a plasma in the processing chamber, comprising:

at least a detector between the high frequency power source and the matching unit or between the matching unit and the discharge electrode, for detecting a reflected wave of the high frequency power reflected form the discharge electrode; and a controller for controlling the high frequency power source so as to temporarily stop or temporarily decrease an application of the high frequency power to the discharge electrode in accordance with a detection result of the detector, wherein the controller controls the high frequency power source so as to temporarily stop or temporarily decrease the application of the high frequency power to the discharge electrode, and when the high frequency power is applied again, the high frequency power is continuously applied to the discharge electrode without stopping or decreasing the application of the high frequency power before a predetermined time passes, and the controller controls so as to temporarily stop or temporarily decrease the application of the high frequency power to the discharge electrode in accordance with the detection result of the detector after the predetermined time passes.

When the high frequency power is applied to the discharge electrode, a plasma discharge is generated between the discharge electrodes. Such a plasma discharge includes a normal discharge and an abnormal discharge (including micro arc). In the normal discharge, when impedance matching is taken by the matching unit, the reflected wave is not generated from the discharge electrode. However, in the abnormal discharge (including micro arc), the reflected wave is generated. The reflected wave at the time of generating the micro arc is detected by the detector. The controller controls the high frequency power source by outputting a control signal, and in accordance with the detection result of the detector, when it is determined that a harmful micro arc is generated to cause damage to the apparatus and the substrate, temporarily stops or temporarily decreases the application of the high frequency power to the discharge electrode. Here, the temporary decrease is to decrease the high frequency power lower than the value of the high frequency power of maintaining the micro arc discharge. Thus, by temporarily stopping or temporarily decreasing the application of the high frequency power to the discharge electrode, only micro arc disappears while the plasma discharge is maintained.

In this way, with a simple structure of temporarily stopping or temporarily decreasing the application of the high frequency power to the discharge electrode in accordance with the detection result of the detector, the generation of the harmful micro arc can be effectively prevented.

In a second aspect, a substrate processing apparatus is provided, comprising:

a high frequency power supply part having a controllable high frequency power source, from which a high frequency power is applied to a discharge electrode provided in a processing chamber through a matching unit, and a plasma is thereby generated in the processing chamber, a directional coupler in the high frequency power supply part for coupling a detector to a reflected wave of the high frequency power reflected from the discharge electrode and/or a traveling wave of the high frequency power advancing toward the discharge electrode;

a detector for detecting a fluctuation of the reflected wave taken out from the directional coupler, when impedance matching is taken by the matching unit between the high frequency power source and the discharge electrode; and a controller for controlling the high frequency power source so as to temporarily stop or temporarily decrease an application of the high frequency power to the discharge electrode in accordance with the detection result of the detector, wherein the detector outputs a level detection signal when the level of the reflected wave is more than a level set value, and outputs a differential detection signal when the level obtained by differentiating the reflected wave is more than the differential set value, and a fluctuation of the reflected wave is thereby detected, and the controller controls the high frequency power source so as to temporarily stop or temporarily decrease an application of the high frequency power to the discharge electrode, when the level detection signal and the differential detection signal are simultaneously outputted from the detector.

The reflected wave at the time of generating the micro arc is taken out by the directional coupler, and the fluctuation of the reflected wave is detected by the detector. The controller outputs the control signal when the micro arc is determined to be harmful, causing a damaging effect on the apparatus and the substrate, and controls the high frequency power source so as to temporarily stop or temporarily decrease the application of the high frequency power to the discharge electrode in accordance with the detection result of the detector. By temporarily stopping or temporarily decreasing the application of the high frequency power to the discharge electrode, only micro arc disappears, while maintaining the plasma discharge.

Thus, with a simple structure of providing the directional coupler, a signal taken out from the directional coupler is detected, and the application of the high frequency power to the discharge electrode is temporarily stopped or temporarily decreased in accordance with the detection result, and the generation of the harmful micro arc is effectively prevented.

Note that even when the micro arc is generated, the micro arc is not always harmful to the apparatus. When the micro arc is generated, with the level of the reflected wave more than a predetermined value having a steep rise, such a micro arc becomes harmful to the apparatus.

Accordingly, by detecting the fluctuation of the reflected wave by the detector, when the level of the reflected wave is more than a level set value and the level obtained by differentiating the reflected wave is more than a differential set value, the generation of the harmful micro arc can be further effectively detected.

In a third aspect, the substrate processing apparatus according to the second aspect is provided, wherein the detector functions to output a delayed traveling wave signal obtained by delaying the traveling wave, in addition to the function to detect the fluctuation of the reflected wave, and the controller functions to control the high frequency power source when the delayed traveling wave signal is outputted.

The application of the high frequency power is temporarily stopped or temporarily decreased, when all conditions are obtained including a delay condition of the traveling wave and a fluctuation condition of the reflected wave. Therefore, by taking only the reflected wave caused by the micro arc, only the harmful micro arc is prevented, irrespective of the reflected wave during normal discharge generated when the impedance matching is not taken at an initial period of discharge.

Note that when all of the conditions are obtained including the delay condition of the traveling wave and the fluctuation condition of the reflected wave, a circuit to control the high frequency power source can be easily realized by an AND circuit.

In a fourth aspect, the substrate processing apparatus according to either of the second aspect or the third aspect is provided, wherein the controller functions to output a control signal from a high frequency power supply part as a monitor signal for controlling the high frequency power source.

By recording and managing the monitor signal, abnormality in a set condition, failure prediction, and a timing requiring maintenance of the substrate processing apparatus can be easily known.

In a fifth aspect, the substrate processing apparatus according to either of the second aspect or the fourth aspect is provided, wherein a stop time for temporarily stopping or temporarily decreasing the application of the high frequency power from the high frequency power source is 100 to 300 μsec.

When the stop time for temporarily stopping or temporarily decreasing the high frequency power is 100 to 300 μsec, usually the generation of the micro arc can be effectively prevented, without having a bad influence on the arc.

In a sixth aspect, the substrate processing apparatus is provided, for processing the substrate by inserting the substrate into a processing chamber, exhausting an atmosphere out of the processing chamber while introducing the gas thereinto, applying a high frequency power to a discharge electrode from a high frequency power source through a matching unit, thereby generating the plasma in the processing chamber, wherein the high frequency power source is controlled so that the reflected wave of the high frequency power from the discharge electrode is detected, and the application of the high frequency power to the discharge electrode is temporarily stopped or temporarily decreased, and thereafter, when the high frequency power is applied again, the high frequency power is continuously applied without temporarily stopping or temporarily decreasing the application of the high frequency power before a predetermined time period passes, and after the predetermined period passes, the application of the high frequency power to the discharge electrode is temporarily stopped or temporarily decreased when the reflected wave is detected.

Thus, the generation of the micro arc can be prevented by a simple method.

Advantages

According to the present invention, the generation of the micro arc can be prevented.

BEST MODES FOR CARRYING OUT THE INVENTION

Best modes for carrying out the invention will be explained with reference to the drawings hereafter.

FIG. 2 is a block diagram of a substrate processing apparatus according to the best mode for carrying out the invention. The substrate processing apparatus is a capacity-coupling type plasma processing apparatus by parallel plate electrodes, comprising a processing chamber 200 for applying plasma processing to a substrate W. The processing chamber 200 is provided therein with a supply and exhaust system (not shown) for exhausting an atmosphere out of the chamber while supplying a processing gas thereto. Also provided are a high frequency power supply part (RF power supply part) 100 for applying a high frequency power (RF power) between a pair of discharge electrodes 210 and 210 disposed in the processing chamber 200, and a matching unit 300 disposed between the RF power supply part 100 and an electrode 210 for matching an impedance of the RF power supply part 100 and the electrode 210.

The RF power supply part 100 includes an RF oscillation part 110 for outputting RF power controllably, a detection means 120 for detecting a reflected wave Pr signal reflected from the electrode 210 disposed in the processing chamber 200 and/or a traveling wave Pf signal (referred to only as a pf/Pr signal hereafter) of the RF power advancing toward the electrodes 210 from the RF oscillation part 110, and a controller 130 applying a high frequency cut signal (RF cut signal) to the RF oscillation part 110 in accordance with a detection result of the detection means 120. The RF cut signal from the controller 130 is taken out as a cut operation monitor output to the outside of the RF power supply part 100.

In some cases, the aforementioned detection means 120 having the RF cutting function, or the detection means 120 and the controller 130 are called a micro arc cutter.

FIG. 1 is a detailed diagram of the RF power supply part 100 of the substrate processing apparatus.

The RF power outputted from the RF oscillation part 110 is taken out to the outside of the RF power supply part 100 through the detection means 120, and inputted in the matching unit 300. In addition, the RF cut signal as a control signal outputted to the RF oscillation part 110 from the controller 130 is also outputted as a cut operation monitor signal (B) to the outside of the RF power supply part 100. Further, a Pf/Pr signal (A) for controlling the matching unit 300 is also outputted from the RF supply part at the initial period of discharge.

The RF oscillation part 110, the detection means 120, and the controller 130 constituting the RF power supply part 100 will be specifically explained hereafter.

The RF oscillation part 110 has a high frequency power source (RF power source) 111. The RF power source 111 comprises an RF oscillator 112 and an RF amplifier 113 capable of controlling an amplification degree. For example, a high frequency signal (RF signal) of 13.56 MHz is generated by the RF oscillator 112, and the RF signal is amplified to a power required for generating the plasma P by the RF amplifier 113. The RF power thus amplified is taken out from the RF oscillation part 110 through a power sensor 114, and inputted in the detection means 120. The RF power thus inputted in the detection means 120 is inputted in the directional coupler 121 constituting a part of the detection means 120, and taken out from the RF power supply part 100 through the directional coupler 121. The RF power thus taken out from the RF power supply part 100 is applied to the electrode 210 disposed in the processing chamber 200 through the matching unit (matching box) 300.

The power required here is, for example, 2000 W. Note that a remaining part of the detection means 120 is constituted by a detector 122 as will be described later.

In addition, the RF oscillation part 110 has a CPU 116. The CPU 116 is capable of temporarily stopping the supply of the RF power.

The power sensor 114 is disposed in an output stage of the RF power source 111 of the RF oscillation part 110. The power sensor 114 detects the traveling Pf signal of the RF power outputted from the RF amplifier 113 and/or the reflected wave Pr signal (Pf/Pr signal) reflected from the electrode 210. The Pf/Pr signal detected by the power sensor 114 is converted into a digital signal by an A/D converter 115, and inputted in the CPU 116. The CPU 116 processes and extends the Pf/Pr signal to about 4 msec, for example, and outputs it. The Pf/Pr signal is converted into an analogue signal again by the D/A converter 117, and outputted to the outside of the RF power supply part 100.

A procedure to realize a temporary stop of the supply of the RF power is constituted as follows. When the RF cut signal is applied to the CPU 116 of the RF oscillation part 110 from the controller 130 as will be described later, the CPU 116 inputs the RF cut signal in the RF amplifier 113 of the RF power source 111, the amplification degree of the RF amplifier 113 is set at zero, and the RF power applied to the electrode 210 is temporarily stopped during output of the RF cut signal. Note that the RF power applied to the electrode 210 may be temporarily stopped by applying the RF cut signal not to the RF amplifier 113 but to the RF oscillator 112, and an oscillation may be temporarily stopped.

Meanwhile, the detection means 120 is constituted by the directional coupler 121 and the detector 122.

The directional coupler 121 is inserted in a transfer system between the RF oscillation part 110 and the matching unit 300, and couples the detector 122 to an RF power wave traveling in the transfer system. Accordingly, the traveling wave Pf signal of the RF power outputted from the power sensor 114 is branched to the matching unit 300 side and the detector 122 side by the directional coupler 121. Also, the reflected wave Pr signal of the RF power reflected from the electrode 210 is branched to the power sensor 114 side and the detector 122 side.

The detector 122 has a detection circuit 123 connected to the directional coupler 121, and by the detection circuit 123, the Pf/Pr signal is detected. Three signals are outputted from the detection circuit 123, which are two Pr signals and one Pf signal. The Pf/Pr signal is constantly monitored by the detection circuit 123 by sampling.

A first Pr signal out of the signals detected by the detection circuit 123 is inputted in a Pr level detecting circuit 124. A second Pr signal is inputted in a differential level detecting circuit 125. A third Pf signal is inputted in a delay circuit 126. Note that the delay circuit 126 can be easily constituted by a CR circuit.

The first Pr signal is compared to the level set value by the Pr level detecting circuit 124. When the Pr level is more than the level set value, a restriction condition (a) of the micro arc as will be described later is regarded to be satisfied, and the Pr level detecting circuit 124 outputs the level detection signal. The second Pr signal is compared to the differential set value by the differential level detecting circuit 125. When the differential level is more than the differential set value, the restriction condition (b) of the micro arc is regarded to be satisfied, and the differential level detecting circuit 125 outputs the differential detection signal. The delay circuit 126 delays the third Pf signal for a predetermined time, and the CR delay circuit 126 outputs a delayed traveling wave signal (micro arc restriction condition (c)).

The level set value of the Pr level detecting circuit 124 is, for example, 100 mVpp, and the differential set value of the differential level detecting circuit 125 is, for example, 400 mVpp/2 μsec.

Each output of the Pr level detecting circuit 124, the differential level detecting circuit 125, and the CR delay circuit 126 is taken out from the detection means 120, and supplied to the controller 130. In the controller 130, the output from each of the circuits 124 to 126 is inputted in an AND circuit 131. A coincidence output signal is outputted from the AND circuit 131 only when detection output is simultaneously inputted in the AND circuit 131 from each circuit 124 to 126. The coincidence output signal is inputted in an RF cut signal output circuit 132, taken out from the controller 130 as the RF cut signal, and supplied to the CPU 116 of the RF oscillation part 110. As described above, when the RF cut signal is supplied from the controller 130, the CPU 116 supplies the cut signal to the RF amplifier 113, wherein the amplification degree of the RF amplifier is set to be zero, and temporarily stops the RF power applied to the electrode 210.

A temporary stop time $T_1$ becoming a pulse width of the RF cut signal is, for example, set to be 200 μsec. Also, an operation sensitivity of the AND to circuit 131 is preferably set to be 2 to 3 μsec corresponding to the pulse width of the micro arc.

The coincidence output signal from the AND circuit 131 is inputted in a peak hold circuit 133, in addition to the RF cut signal output circuit 132. The pulse width of the coincidence output signal is extended for a predetermined time by the peak hold circuit 133 and outputted, then taken out from the controller 130 and the RF power supply part 100 as a cut operation monitor signal B. The cut operation monitor signal is reported to an upper computer (not shown) generally controlling the substrate processing apparatus.

The aforementioned predetermined time is preferably set to be 200 msec. In this case, the cut operation monitor signal (B) of the pulse width of 200 msec is outputted per every output of the coincidence output signal from the AND circuit 131.

Here, the aforementioned three restriction conditions (a) to (c) of the micro arc will be explained hereunder.

(a) To Set the Pr Level to be not Less than a Predetermined Value.

Even if a Pr output is generated, there occurs no problem when its amplitude (level) is in a small range. However, there occurs a problem when the amplitude becomes large to some extent. In other words, when the Pr level becomes a predetermined value, its Pr wave form is required to be cut by a predetermined value, so as not to generate the Pr level of more than the predetermined value. Accordingly, by detecting a rise level of the Pr output, it is necessary to determine whether or not the micro arc generated from such a value of the level is harmful.

(b) To Set the Pr Differential Level to be not Less than a Predetermined Value.

When the Pr output is steep, the problem involves therein. Accordingly, a Pr output waveform is differentiated and the inclination thereof is detected as a level. When the Pr output waveform is formed in a smaller curve, it appears that a strong arc discharge is not generated, and almost no damage is caused in the processing chamber. When the Pr output waveform is steep, it appears that the strong arc discharge is generated, and the damage caused to the surface of the metal electrode, the substrate, and further an inner wall of the processing chamber is huge.

(c) To Detect Only the Reflected Wave Pr Generated After Stable Discharge is Started.

By eliminating the reflected wave $Pr_0$ at initial period of discharge, only the reflected wave $Pr_1$ of the micro arc generated after the Pf is stabilized, is required to be detected. Note that it is difficult to detect a reflected wave $Pr_1$ signal of the micro arc directly from a Pf signal, because the $Pr_1$ is relatively smaller than the Pf signal.

Next, action of the aforementioned structure, namely, the action of a micro arc cutter will be explained.

As a processing condition, when forming a silicon nitride film (SiN), for example, a wafer temperature is set to be 280 to 350° C., the kind of gas is set to be $SiH_4$, $NH_3$, and $N_2$ (including $H_2$ in some cases), processing pressure is set to be 50 to 400 Pa, and RF power is set to be 3000 to 7000 W.

(1) Initial Period of Discharge

An atmosphere is exhausted out of the processing chamber 200, while introducing the gas thereinto. By turning on the RF power source 111, the RF power is supplied between a pair of electrodes 210 provided in the processing chamber 200, through the directional coupler 121 and the matching unit 300, and the plasma P is thereby generated between the electrodes 210.

As shown in FIG. 6(*a*), when the RF power source 111 is turned on, the RF power (traveling wave Pf) is increased stepwise, and in this process, the plasma P is generated. When the RF power reaches a predetermined value, supply of the RF power is switched to a stable supply. When the micro arc is generated after the stable supply of the RF power, the reflected wave $Pr_1$ reflected from the electrodes 210 is superimposed on the traveling wave pf, and the level of the traveling wave Pf is fluctuated. However, the level of the reflected wave $Pr_1$ is very small compared with the level of the traveling wave Pf. Therefore, it is difficult to detect the reflected wave $Pr_1$ from the fluctuation of the level of the traveling wave Pf.

In addition, when the RF power source 111 is turned on, as shown in FIG. 6(*b*), the reflected wave Pr reflected from the electrodes 210 is generated during discharge and at the initial period of discharge also. The reflected wave generated during discharge is defined as $Pr_1$, and the reflected wave generated at the initial period of discharge is defined as $Pr_0$. The reflected wave $Pr_0$ is generated even at the initial period of discharge. This is because by turning on the RF power source 111, the matching unit 300 is controlled by a Pf/Pr signal outputted from the CPU 116 (in some cases, from an automatic control circuit within the matching unit 300), and impedance matching of the RF power source 111 and the electrodes 210 is taken, however, at initial period of discharge, the impedance matching is not taken yet. In order to eliminate the reflected wave $Pr_0$ generated at the initial period of discharge, the traveling wave Pf is delayed for a predetermined time by the delay circuit 126 of the detector 122.

At the initial period of discharge, the traveling wave Pf detected by the detection circuit 123 of the detector 122 is delayed by the delay circuit 126, and therefore AND conditions of the AND circuit 131 of the controller 130 is not satisfied. Accordingly, at the initial period of discharge until the impedance matching is taken, even when the reflected wave Pr exceeding a Pr level set value and a Pr differential level set value is detected, the RF cut signal is not outputted from the controller 130.

In addition, at the initial period of discharge, by controlling the matching unit 300 by the Pf/Pr signal outputted from the RF power supply part 100 (or in some cases, from the automatic control circuit within the matching unit 300), the impedance matching of the RF power source 111 and the electrodes 210 is taken.

(2) During Discharge

According to this embodiment, the reflected wave $Pr_1$ generated during discharge is cut in the following way.

As shown in FIG. 3, during discharge, three reflected waves A, B, and C are assumed to be detected from the detection circuit 123 of the detector 122. As shown in FIG. 4 in detail, the reflected wave is generated in micro sec order, and in regards to the reflected wave A, inclination of the waveform is larger than 400 mVpp/2 μsec, which is a differential set value, and steep, but the Pr detection level is smaller than 100 mVpp, which is a level set value. In regards to the reflected wave B, the Pr detection level is larger than 100 mVpp, which is a level set value, but the inclination of the waveform is smaller than 400 mVpp/2 μsec and formed in a smaller curve. In regards to the reflected wave C, the Pr detection level is larger than each set value, the inclination of the waveform is large and steep, and therefore the reflected wave C is required to be cut by a micro cutter.

The reflected waves A, B, and C are taken out by the directional coupler 121, and inputted in the detector 122. In regards to the reflected wave A, the detection signal is not outputted from the Pr detection level 124, however, the detection signal is outputted from the Pr differential level detecting circuit 125. In regards to the reflected wave B, the detection signal is outputted from the Pr detection level detecting circuit 124, however the detection signal is not outputted from the Pr differential level detecting circuit 125.

In regards to the reflected wave C, the Pr detection level is more than 400 Mvpp, exceeding the set value, and therefore the detection signal is outputted from the Pr level detecting circuit 124. The Pr differential level is also steep, exceeding the set value, and therefore the detection signal is outputted from the Pr differential level detecting circuit 125. Further, the reflected wave C is generated during a stable discharge period, which is out of the initial period of discharge, and therefore a delay Pf signal is outputted from the CR delay circuit 126.

Accordingly, all coincidence conditions of the AND circuit 131 are satisfied, and the RF cut signal is outputted to the CPU 116 from the RF cut signal output circuit 132. By this signal, as shown in FIG. 3, the amplification degree of the RF amplifier 113 of the RF power source 111 is set to be zero for a stop time T1 previously set to have a pulse width of the RF cut signal, and output of the RF power Pf shown by a dotted line is temporarily stopped by CPU 116. By this stop of the Pf output, the reflected wave C from the electrodes 210 is immediately cut to disappear before growing to a larger size. After the temporary stop time $T_1$ passes, the amplification degree of the RF amplifier 113 of the RF power source 111 returns to an original amplification degree, and supply of the RF power is started again, to supply the RF power of 2000 W to the electrodes 210. However, RF cut operation is inhibited for the time $T_2$ from starting the supply of power. This is because when the Pf output is stopped again within the time $T_2$, normal discharge can not be maintained. Therefore, the time $T_2$ becomes an unmonitored time.

As described above, when the output of the RF power Pf is temporarily stopped, the output to the AND circuit 131 is set off by the delay time at the delay circuit 126, and the output to the AND circuit 131 is set on after the delay time passes. In this way, in order to eliminate the reflected wave $Pr_0$ generated at the initial period of discharge, the output of the traveling wave Pf is delayed by the delay circuit 126. Therefore, the delay time at the initial time of discharge is equal to the delay time when the RF power Pf output is temporarily stopped. By a circuit structure thus constituted, one delay circuit is capable of delaying the traveling wave at initial period of discharge and after temporary stop of the output of the RF power Pf. This contributes to simplifying the circuit of an apparatus.

After a cut operation inhibiting time $T_2$ passes, under a normal monitoring system, development of the micro arc is immediately prevented by repeating the aforementioned RF cut operation each time the micro arc is generated.

Here, preferably the temporary stop time $T_1$ to stop the supply of the RF power by performing the RF cut operation is set to be 100 to 300 μsec. This is because when the temporary stop time $T_1$ is set to be shorter than 100 μsec, the micro arc does not disappear. When the temporary stop time $T_1$ is set to be longer than 300 μsec, arc discharge itself is stopped, the plasma P disappears, and a reactive product and a particle trapped in the circumference of the plasma fall on a wafer. Accordingly, the temporary stop time may be in the range from 100 to 300 μsec. The value of the temporary stop time is not so much correlated to the substrate processing apparatus, the magnitude of the RF power, and the size of the substrate, but is approximately in common. This is because the micro arc is generated locally.

Note that preferably the cut operation inhibiting time $T_2$ is set to be 500 μsec, for example.

(3) Report of the Generation of Micro Arc

Each time the coincidence signal is outputted from the AND circuit 131, the output thereof is inputted in a peak hold circuit 133, converted into a signal having a pulse width of at least 200 msec, and taken out from the RF power supply part 100 as a cut operation monitor signal (B). This is because operational sensitivity of the AND circuit 131 of the controller 130 is 2 to 3 μsec, and even if the signal with short pulse width is taken out as it is from the RF power supply part 100, a clock period of the CPU of an overall apparatus is more delayed than the pulse width, thus posing a problem that the upper computer of the substrate processing apparatus can not detect the cut operation monitor signal. Therefore, the pulse width of the coincidence output signal of about 2 to 3 μsec is expanded to about 200 msec in the peak hold circuit 133. Therefore, the cut operation monitor signal can be sampled by the upper computer, and it can be surely detected.

The cut operation monitor signal is counted by the upper computer, and from the number of the count, it is found that frequency of the cut operation monitor signal is increased. The life span of the electrode is thus obtained, or whether or not there is a problem in plasma condition setting can be determined. Specifically, when the frequency of the cut operation signal is increased, deterioration in a state of the electrode, positional deviation of the substrate by an error in handling of the substrate, occurrence of abnormality, condition parameters (RF power supply abnormality, abnormality in matching unit, and abnormality in processing chamber pressure or the like) and so forth can be checked. As a result, huge damage can be previously prevented.

(4) End of Discharge

After a predetermined period of plasma processing is applied to the substrate, gas introduction and RF power application are ended to complete the substrate processing.

As described above, according to the micro arc cutter of this embodiment, the reflected wave Pr is steeply fluctuated when the micro arc is generated. Therefore by detecting the fluctuation of the reflected wave Pr, supply of the RF power is stopped from the detection output, and therefore the generation of the micro arc can be effectively prevented. In this case, the micro arc causing damage to the apparatus and the substrate is defined by the level of the reflected wave and the inclination of the level, and only when such a definition is satisfied, the fluctuation of the reflected wave is detected. Therefore, it is possible to effectively prevent only the generation of the micro arc truly causing damage.

When the micro arc is generated during normal continuous arc discharge, the RF power is temporarily stopped. Therefore, only the generation of the micro arc can be prevented. In addition, after the supply of the RF power is temporarily stopped, the supply of the RF power is started again. Therefore, the plasma can be immediately regenerated in an original state, without disappearance of plasma or diminishing of the entire body of a plasma discharge region. Accordingly, the reactive product or the like trapped in the circumference of the plasma does not fall on the substrate, the distribution in film thickness of the substrate does not locally abnormal, and a total yield is thereby improved. Further, the damage caused to the apparatus is reduced, and a maintenance cycle time can be made long. As a result, working efficiency and the productivity of the apparatus can be improved.

After the high frequency power is temporarily stopped (micro arc is cut), when the high frequency power is applied again, the abnormal discharge is easy to generate in an initial stage, and a state of temporarily stopping the high frequency power is continued a plurality of number of times without break. However, in this state, the plasma discharge disappears. When the plasma discharge disappears, there is no choice but dump the substrate during processing. However, in the present invention, even if the high frequency power is applied again after the high frequency power is temporarily stopped, the disappearance of the plasma discharge does not occur, thereby not causing a situation to dump the substrate, when the abnormal discharge is disregarded for 500 μsec even if it occurs.

Although the abnormal discharge may sometimes occur during a period thus disregarding it in the present invention, the damage caused by such an abnormal discharge is limited to a local breakage of a product. Therefore, the entire body of the substrate is prevented from being defective, and only the semiconductor apparatus or a liquid crystal display of the part where the abnormal discharge occurs is defective. This contributes to improving the yield.

In the aforementioned embodiment, the directional coupler 121 is provided between the power sensor 114 and the matching unit 300. However, if the matching of impedance is taken, the directional coupler 121 may be provided between the matching unit 300 and the electrode 210.

In addition, when three condition signals outputted from the detector 122 are all satisfied by providing the AND circuit in the controller, the RF cut signal is outputted. However, the Pr level detection signal and the differential level detection signal may be supplied to an OR circuit, instead of the AND circuit. In this way, by satisfying either of (1) or (2) of micro arc preventing conditions, the RF cut signal is outputted, and the generation of the micro arc can be forcibly prevented.

Moreover, in this embodiment, explanation is given to the case in which the application of the high frequency power to the electrode is temporarily stopped. However, the present invention is not limited thereto. For example, the value of the high frequency power may be temporarily decreased. Here, temporary decrease is to decrease the value of the high frequency power to be lower than the value of maintaining the micro arc discharge. In a wafer processing, for example, when the high frequency power is decreased to 0 to 20 W during plasma discharge of 200 W, the micro arc discharge stops to generate (the value of 0 to 20 W changes in accordance with the change in conditions such as an area of the electrode, the high frequency power applied to an discharge electrode, and pressure or the like).

DESCRIPTION OF NUMERALS AND SIGNS

Figure 1:
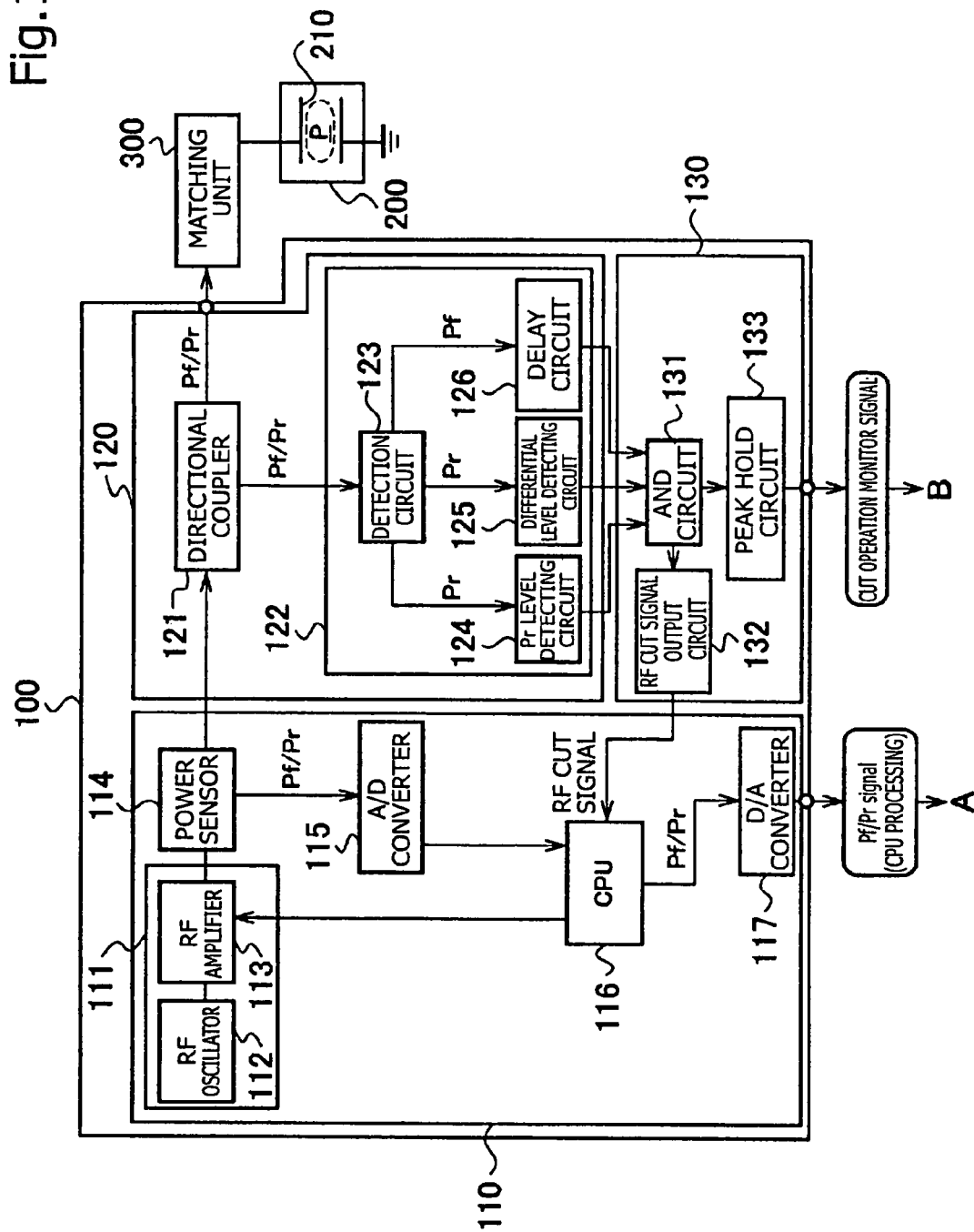
FIG. 1 is a detail view of a high frequency power supply part of a substrate processing apparatus according to an embodiment.
Figure 2:
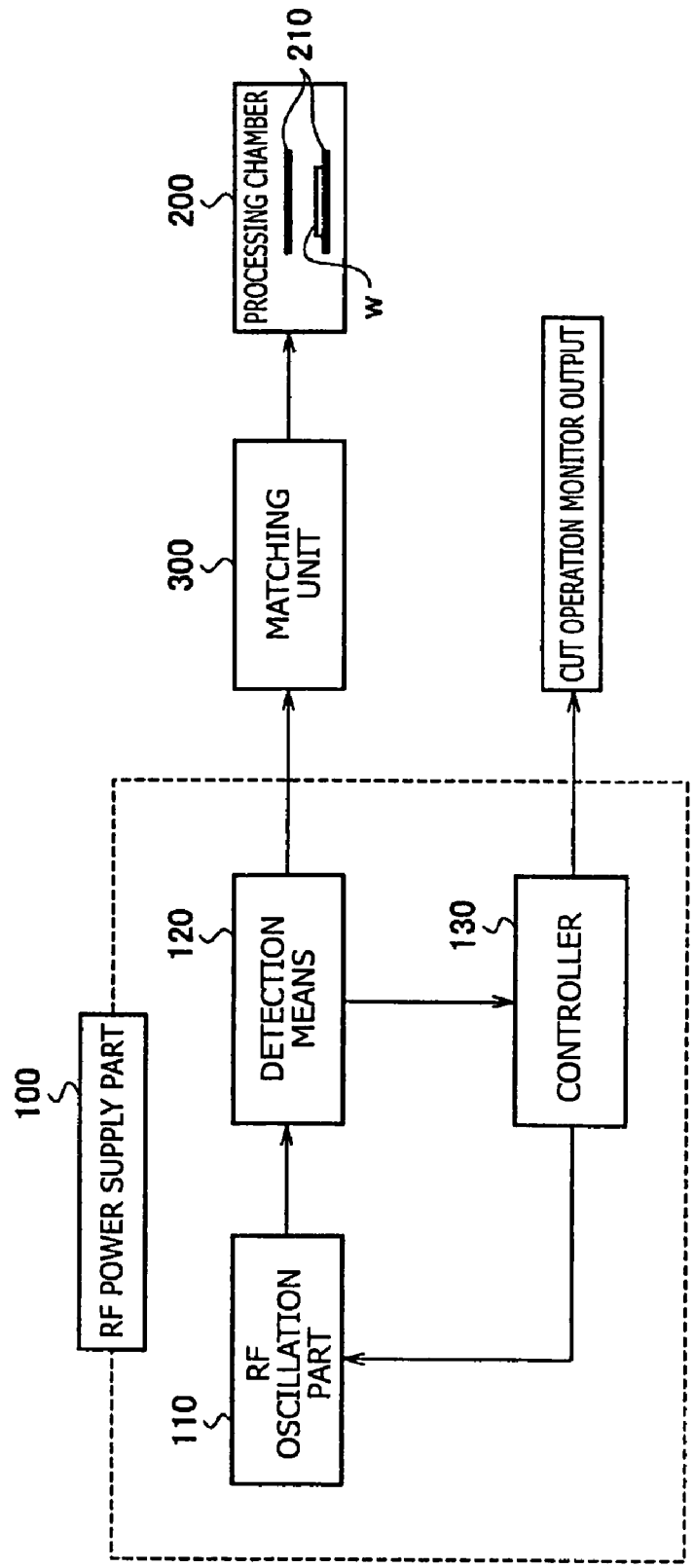
FIG. 2 is a block diagram of the substrate processing apparatus according to the embodiment.
Figure 3:
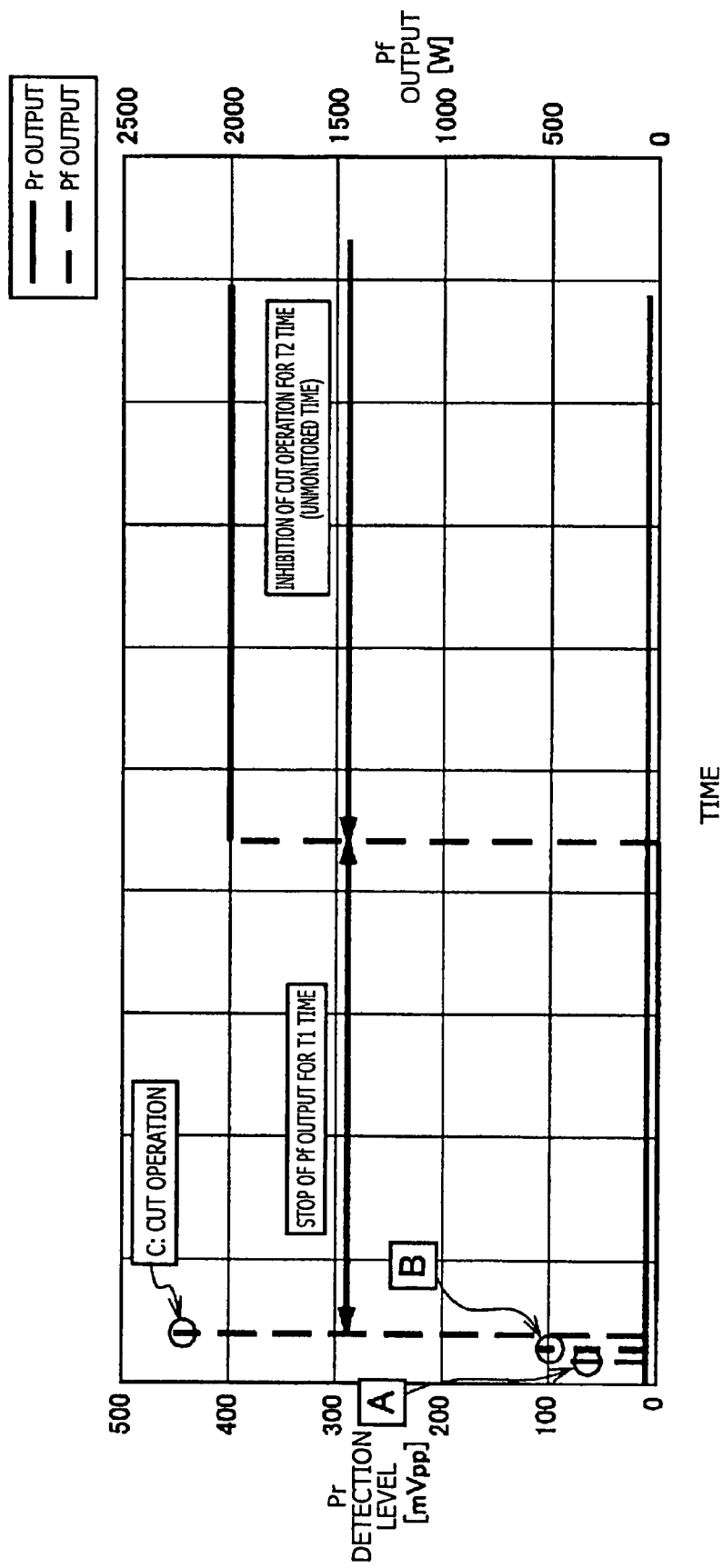
FIG. 3 is a control characteristic view of a Pr detection level and a Pf output according to the embodiment, explaining a control operation of the high frequency power supply part.
Figure 4:
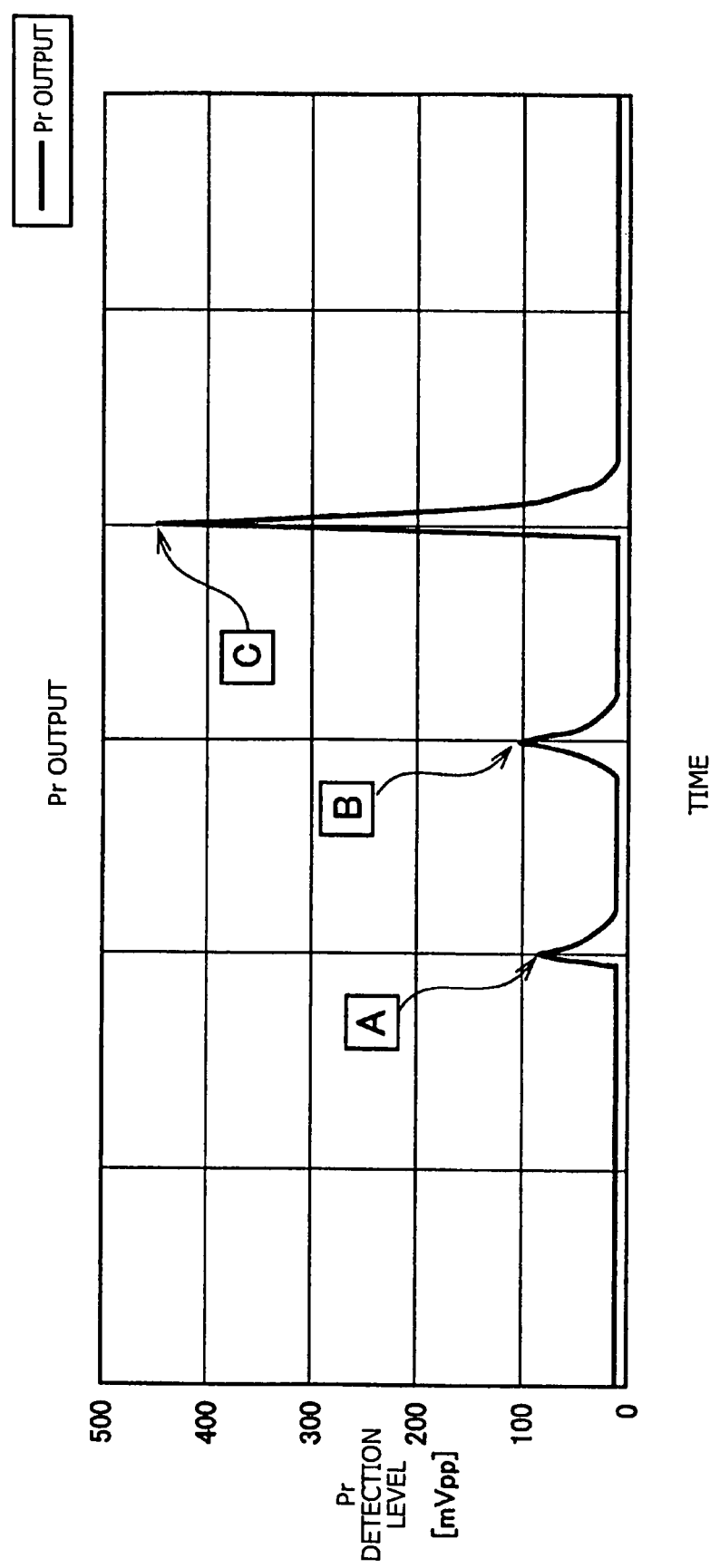
FIG. 4 is an explanatory view of the Pr detection level according to the embodiment, when a reflected wave is generated.
Figure 5:
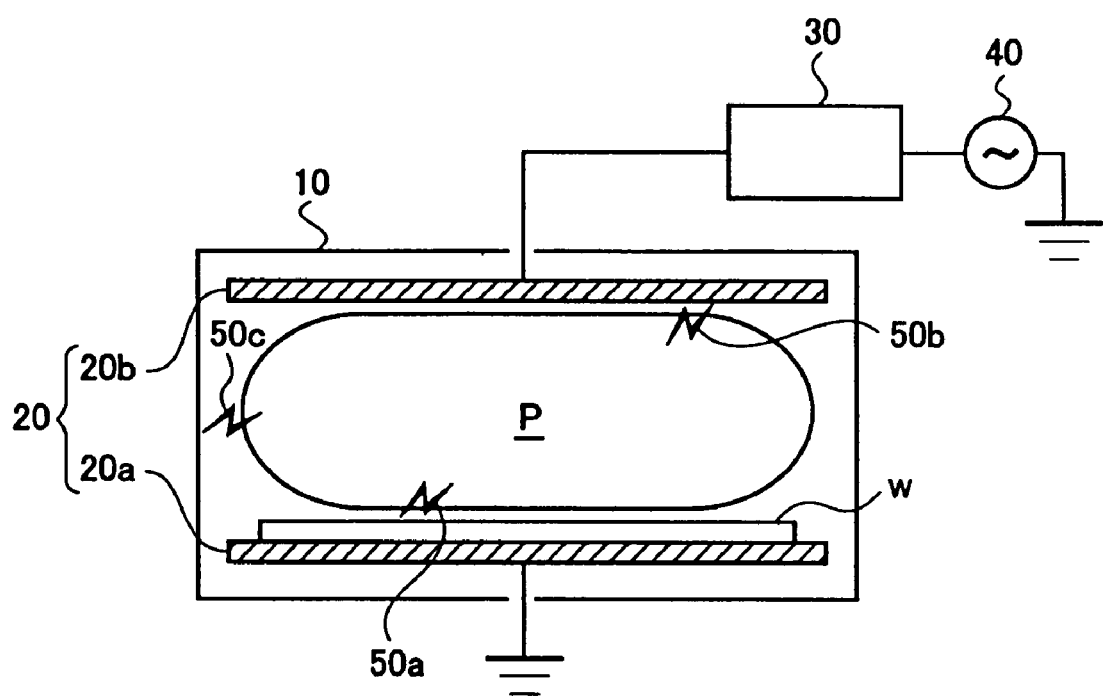
FIG. 5 is a schematic explanatory view of a capacity-coupling type plasma processing apparatus by parallel plate electrodes in common to the conventional example and embodiment.
Figure 6:
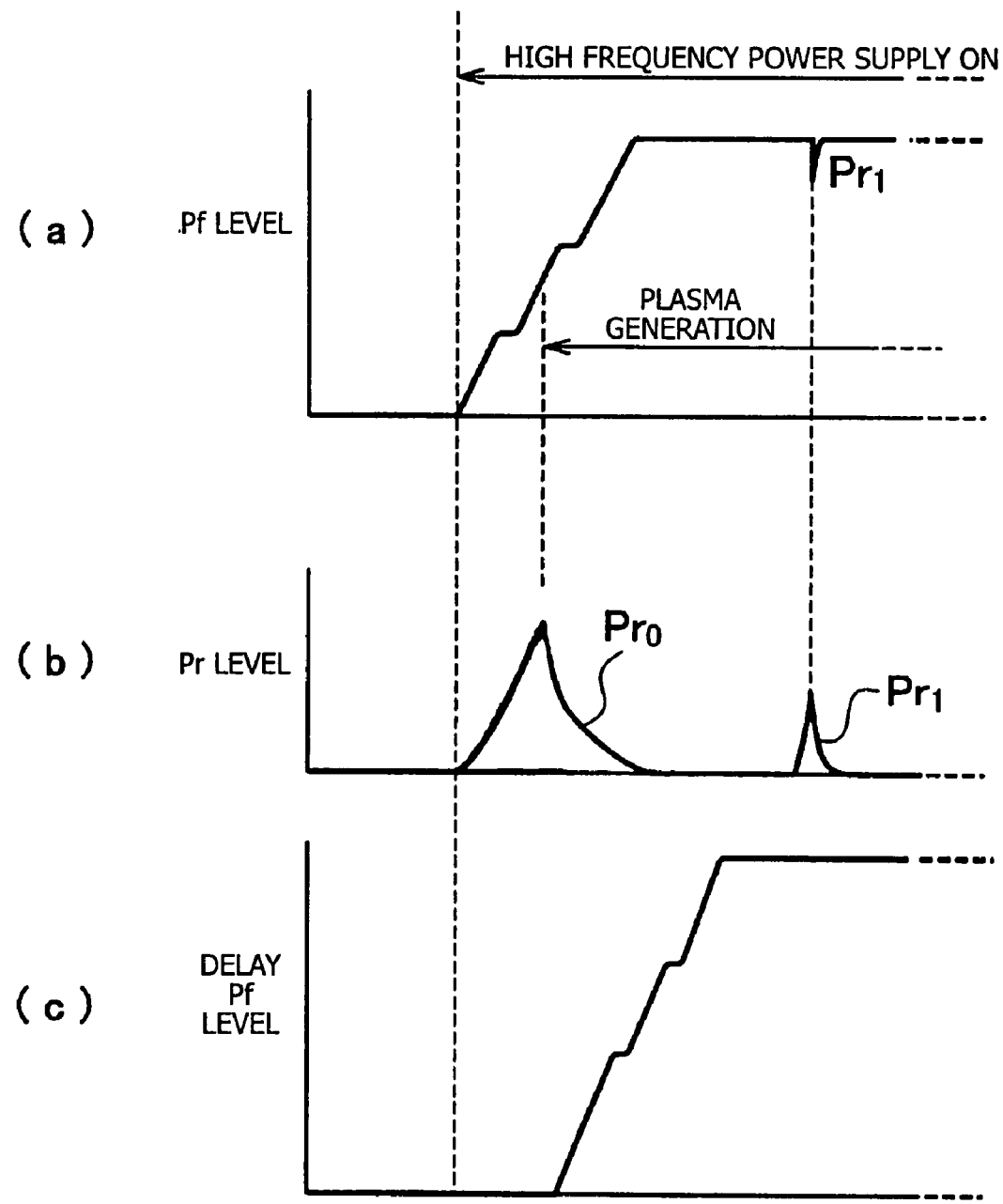
FIG. 6 is an explanatory view showing a high frequency power wave according to the embodiment, wherein (a) is a waveform chart of a Pf level, (b) is the waveform chart of a Pr level, and (c) is the waveform chart of a delay Pf level.

P Plasma
100 High frequency power supply part

111 High frequency power source
120 Detection means
121 Directional coupler
122 Detector
123 Detection circuit
126 Delay circuit
130 Controller
131 AND circuit
132 RF cut signal output circuit
133 Peak hold circuit
200 Processing chamber
210 Electrode (discharge electrode)
300 Matching unit

What is claimed is:

1. A substrate processing apparatus, which has a high frequency power supply part with a controllable high frequency power source, applies a high frequency power from the high frequency power source to a discharge electrode provided in a processing chamber through a matching unit, and generates a plasma in the processing chamber, comprising:
 a detector that detects a traveling wave of the high frequency power applied to the discharge electrode and a reflected wave of the high frequency power reflected from the discharge electrode between the high frequency power source and the matching unit, or between the matching unit and the discharge electrode; and
 a controller that controls the high frequency power source so as to temporarily stop or temporarily decrease an application of the high frequency power to the discharge electrode, in accordance with a detection result of the reflected wave,
 wherein
 the detector:
  outputs a level detection signal when the level of a detection output of the reflected wave is more than a level set value, and outputs a differential detection signal when the level obtained by differentiating a detection output of the reflected wave is more than the differential set value, and a fluctuation of the reflected wave is thereby detected, and
  delays a detection output of the traveling wave for a predetermined time period, and
 the controller:
  controls the high frequency power source so as to temporarily stop or temporarily decrease an application of the high frequency power to the discharge electrode, when the level detection signal and the differential detection signal are simultaneously output from the same detector, and
  when the high frequency power is applied again after temporarily stopping or temporarily decreasing the application of the high frequency power to the discharge electrode, controls the high frequency power source so as to continuously apply the high frequency power without temporarily stopping or temporarily decreasing the application of the high frequency power before the predetermined time period passes in accordance with a delaying result of the traveling wave, and after the predetermined time period passes, temporarily stop or temporarily decrease the application of the high frequency power to the discharge electrode when the level detection signal and the differential detection signal are simultaneously outputted from the detector.

2. The substrate processing apparatus according to claim 1, wherein the controller outputs a control signal as a monitor signal.

3. The substrate processing apparatus according to claim 1, wherein time for temporarily stopping or temporarily decreasing the high frequency power is 100 to 300 μseconds.

* * * * *